United States Patent
Lin

(10) Patent No.: US 6,225,214 B1
(45) Date of Patent: May 1, 2001

(54) METHOD FOR FORMING CONTACT PLUG

(75) Inventor: Dahcheng Lin, Hsinchu (TW)

(73) Assignee: Taiwan Semicondutor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/395,111

(22) Filed: Sep. 14, 1999

(30) Foreign Application Priority Data

Aug. 13, 1999 (TW) .................................. 88113867

(51) Int. Cl.$^7$ ................................ H01L 21/4763
(52) U.S. Cl. .................... 438/629; 438/647; 438/657; 438/658; 438/659; 438/660; 438/684
(58) Field of Search ...................... 438/629, 647, 438/657, 658, 659, 660, 684

(56) References Cited

U.S. PATENT DOCUMENTS

| | | | |
|---|---|---|---|
| 4,829,024 | * 5/1989 | Klein et al. | 438/657 |
| 5,141,892 | * 8/1992 | Beinglass | 437/162 |
| 5,326,722 | * 7/1994 | Huang | 437/186 |
| 5,444,302 | * 8/1995 | Nakajima et al. | 257/755 |
| 5,759,905 | * 6/1998 | Pan et al. | 438/647 |
| 5,976,961 | * 11/1999 | Jung et al. | 438/684 |
| 6,067,680 | * 5/2000 | Pan et al. | 438/647 |

* cited by examiner

Primary Examiner—John F. Niebling
Assistant Examiner—Lynne A. Gurley
(74) Attorney, Agent, or Firm—Jiawei Huang; J.C. Patents

(57) ABSTRACT

A method for forming a contact plug. A substrate having a dielectric layer thereon is provided. The dielectric layer has an opening that exposes a thin layer of native oxide. A first and a second conformal doped polysilicon layer are formed over the opening. The first doped polysilicon layer has a dopant concentration greater than that of the second doped polysilicon layer. A third doped polysilicon layer that also fills the opening is formed over second doped polysilicon layer. Dopant concentration of the third doped polysilicon layer is smaller than the second doped polysilicon layer. Last, the first, the second and the third doped polysilicon layer are annealed.

11 Claims, 3 Drawing Sheets

METHOD FOR FORMING CONTACT PLUG

CROSS-REFERENCE TO RELATED APPLICATION

This application claims the priority benefit of Taiwan application serial no. 88113867, filed Aug. 13, 1999, the full disclosure of which is incorporated herein by reference.

BACKGROUND OF THE INVENTION

1. Field of the Invention

The present invention relates to a method of deposition. More particularly, the present invention relates to a method for forming a contact plug.

2. Description of the Related Art

In general, contact resistance is dependent upon the contact area or dimensions of the contact window. As dimensions of the contact window shrink, contact resistance will increase correspondingly. For a device having a line width smaller than 0.18 µm, contact resistance can be so high that special processing steps have to be executed.

In the design of DRAMs, a polysilicon plug is one of the most common contact structures for connecting a conductive layer with an N+ or an N− silicon substrate. The contact is a polysilicon/polysilicon contact region. One of the problems for forming such a contact structure is that a layer of thin native oxide is usually formed at the substrate surface due to exposure to air during processing. Although the thin native oxide layer has little effect on contact resistance when the contact area is large, the presence of a native oxide layer can increase contact resistance considerably when the contact opening is small.

SUMMARY OF THE INVENTION

Accordingly, one object of the present invention is to provide a method for forming a contact plug capable of reducing contact resistance caused by native oxide formation.

To achieve these and other advantages and in accordance with the purpose of the invention, as embodied and broadly described herein, the invention provides a method form forming a contact plug. A substrate having a dielectric layer thereon is provided. The dielectric layer has an opening that exposes a thin layer of native oxide. A plurality of conformal doped polysilicon layers each having a different dopant concentration is sequentially formed over the opening. Dopant concentration of the polysilicon stack increases towards the bottom of the opening. A top doped polysilicon layer with a dopant concentration smaller than all of doped polysilicon layers in the polysilicon stack is formed over the polysilicon stack so that the opening is completely filled. Lastly, the top doped polysilicon layer and the polysilicon stack are annealed.

In this invention, the contact plug consists of a stack of conformal doped polysilicon layers inside a contact opening. By forming a polysilicon stack inside a contact opening such that the dopant concentration is higher towards the bottom of the contact opening, contact resistance of the contact plug is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
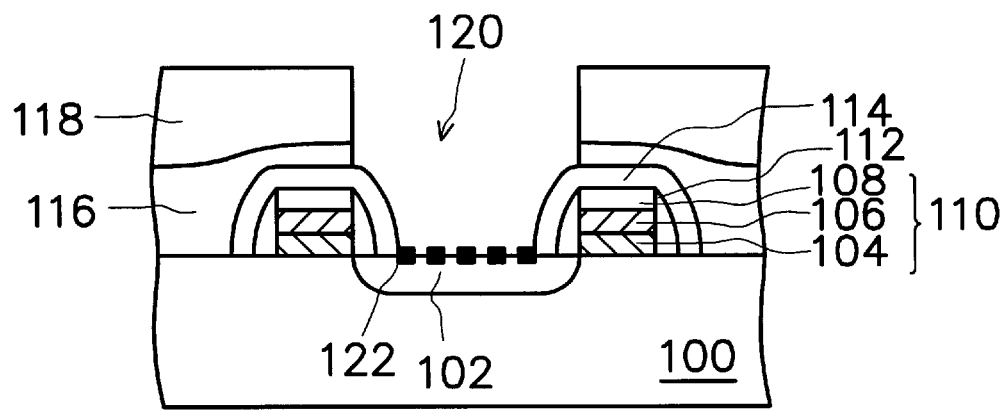
FIGS. 1A through 1G are schematic cross-sectional views showing the progression of manufacturing steps for producing a contact plug according to this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the progression of manufacturing steps for producing a contact plug according to this invention.

As shown in FIG. 1A, a silicon substrate 100 is provided. The silicon substrate 100 has two gate electrode structures 110. Each electrode gate structure 110 comprises a doped polysilicon layer 104, a tungsten silicide layer 106 and a tetra-ethyl-ortho-selicate (TEOS) layer 108. In addition, spacers 112 are also formed on the sidewalls of the gate electrode structure 110, and a conformal silicon nitride layer 114 is formed over the gate electrode structures 110 and the spacers 112.

Furthermore, a TEOS dielectric layer 116 and an oxide layer 118 are formed over the substrate 100 and the silicon nitride layer 114. An opening 120 that exposes the substrate 100 between the two gate electrode structures 110 is formed in the TEOS dielectric layer 116 and the oxide layer 118. The exposed substrate contains a thin native oxide layer 122. There is a common source/drain region 102 in the substrate 100 between the two electrode gate structures 110. The opening 120 that exposes the source/drain region 102 is a contact opening. The source/drain region 102 can be, for example, an arsenic-implanted region (an N+ region) or a phosphorus-implanted region (an N− region).

Although the aforementioned contact opening 120 is surrounded by features as described, it is by no means the only configuration suitable for the invention described below. The features around the contact opening 120 are used as an illustration, only. In fact, any opening whose bottom surface contains a thin native oxide layer so that a high contact resistance may result is also within the scope of the invention.

Figure 1B:
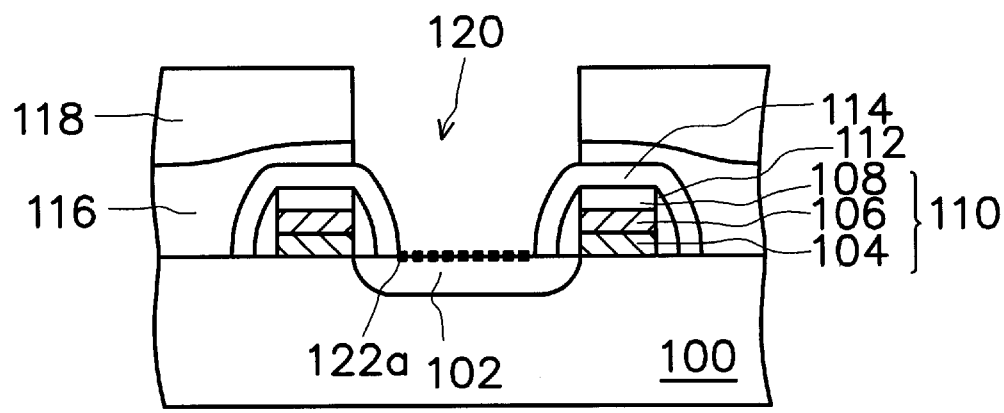

As shown in FIG. 1B, the exposed substrate 100 is cleaned to remove a portion of the native oxide layer 122 (as shown in FIG. 1A) so that a clean native oxide layer 122a is formed.

Figure 1C:
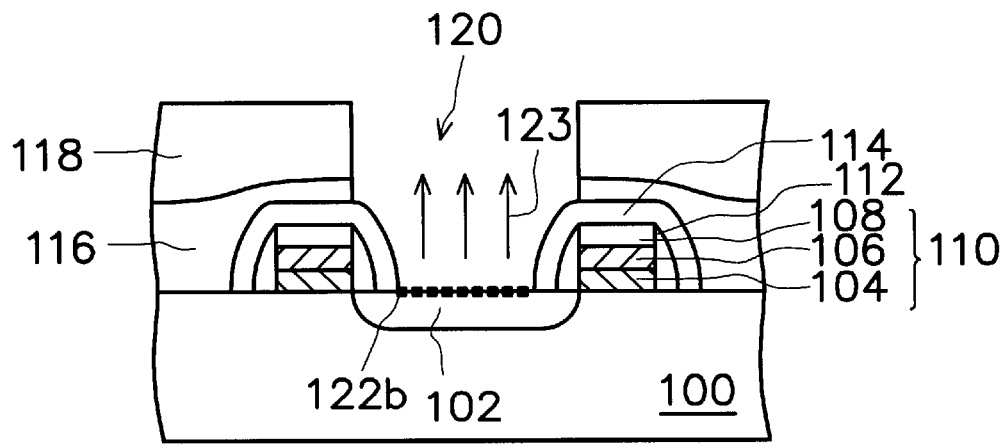

As shown in FIG. 1C, the substrate 100 is placed inside the chamber of an ultra-high vacuum system. An annealing operation is carried out in a high vacuum so that a portion of native oxide in the thin native oxide layer 122a reacts according to the following formula and turn into a gaseous product $SiO_{(g)}$ 123: $Si_{(s)} + SiO2_{(s)} \rightarrow 2SiO_{(g)}$. Ultimately, a portion of the oxide on the native oxide layer 122a is removed and turned into a native oxide layer 122b.

Figure 1D:
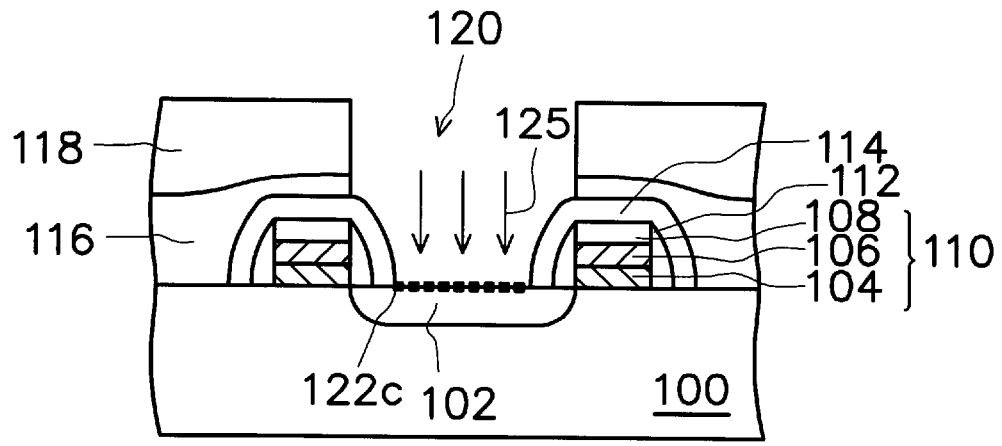

As shown in FIG. 1D, gaseous phosphine ($PH_3$) 125 is used to reduce the remaining native oxide layer 122b (shown in FIG. 1C) so that the treated layer 122b turns into a native oxide layer 122c. The phosphine treatment serves to reduce contact resistance.

Figure 1E:
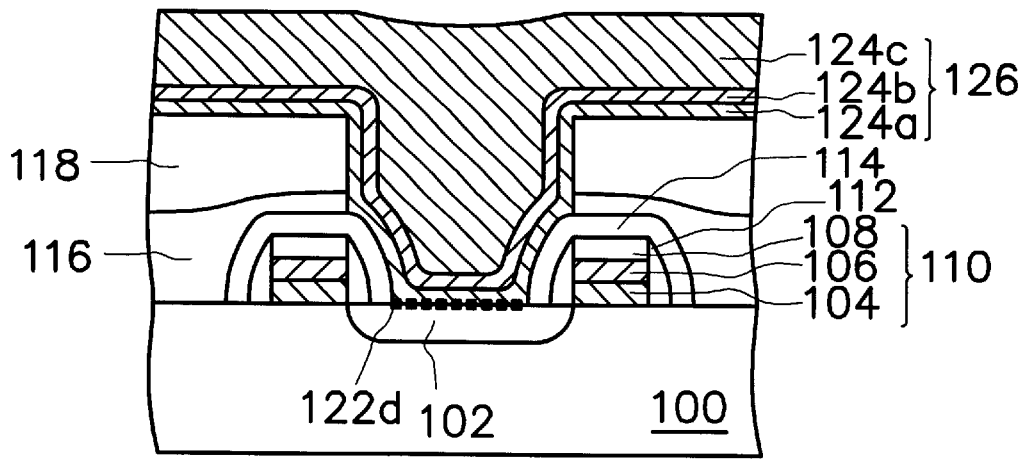

As shown in FIG. 1E, a first conformal doped polysilicon layer 124a and a second conformal doped polysilicon layer 124b having a thickness of between about 20 Å and 100 Å are sequentially formed over the exposed interior of the opening 120. A third doped polysilicon layer 124c is formed over the second doped polysilicon layer 124b such that the entire opening 120 is filled. The first, the second and the third doped polysilicon layers together constitute a polysilicon stack 126. The native oxide layer 122c is now covered by the polysilicon stack 126 and is re-labeled 122d.

The first doped polysilicon layer 124a preferably has a dopant concentration of more than about 6.0E20 atoms/cm$^3$ and the second doped polysilicon layer 124b preferably has a dopant concentration of about 4.0E20 atoms/cm$^3$. The third doped polysilicon layer 124c preferably has a dopant concentration of between about 5E19 and 2.0E20 atoms/cm$^3$. The dopants can be, for example, phosphorus. The deposition of all three polysilicon layers 124a, 124b and 124c can be carried out in the same furnace unit.

Note that the number of doped polysilicon layers in the polysilicon stack 126 is not limited to just three. However, dopant concentration of the doped polysilicon layer must be higher the closer it is to the bottom of the opening 120. This is because the dopants closest to the contact surface are more effective in reducing contact resistance. In general, dopant concentration can be as high as 9E20 atoms/cm$^3$ before the polysilicon layer is saturated. In other words, the doped polysilicon layer next to the bottom substrate surface can have a dopant concentration of up to 9E20 atoms/cm$^3$. On the other hand, the polysilicon layer furthest from the substrate surface can have a dopant concentration of a conventional polysilicon plug (such as 5E19 to 2.0E20 atoms/cm$^3$).

Figure 1F:
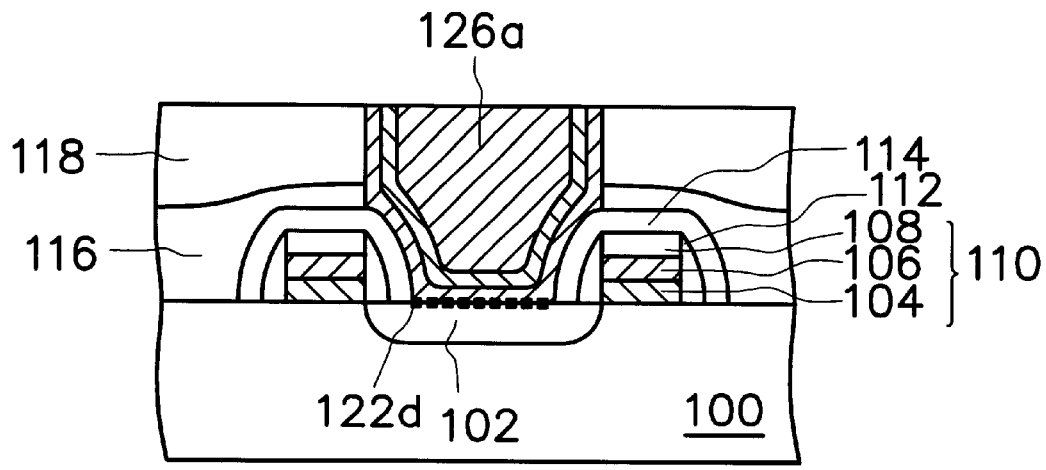

As shown in FIG. 1F, a portion of the polysilicon stack 126 (shown in FIG. 1E) outside the opening 120 (shown in FIG. 1D) is removed to form a polysilicon plug 126a inside the opening 120. This step can be carried out by chemical-mechanical polishing or reactive ion etching.

Figure 1G:
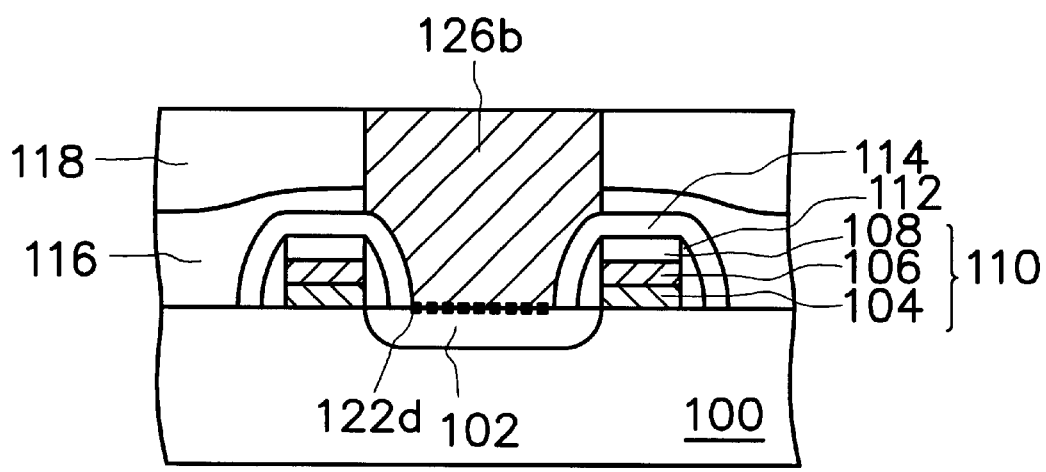

As shown in FIG. 1G, an annealing operation is carried out so that the diffusion of dopants inside the polysilicon plug 126a is possible and a homogeneous material layer is created. By annealing the polysilicon plug 126a, the junction leakage problem is improved. This is possible because the thickness of the doped polysilicon layers such as 124a and 124b (shown in FIG. 1E) is quite small (from about 20 Å to 100 Å, depending on design). In addition, the concentration of dopants inside the doped polysilicon layers 124a and 124b is different. Dopants diffuse according to a dopant concentration gradient. The smaller the dopant concentration gradient, the slower will be the diffusion rate. Hence, the higher the dopant concentration will be remained at the contact surface.

One possible means of reducing concentration gradient between neighboring layers is to increase the number of the doped polysilicon layers. Since the number of doped polysilicon layers used in this invention can be more than three, a greater number layers facilitates the reduction of concentration gradient between neighboring polysilicon layers.

To illustrate how an increase in the number of doped polysilicon layer can reduce the concentration gradient of neighboring layers, a contact plug having five layers is chosen as an example. Assume that a first, second, third and a fourth conformal doped polysilicon layer are sequentially formed with a fifth doped polysilicon layer filling the opening. The concentration of dopants from the first to the fifth doped polysilicon layers can be 9E20 atoms/cm$^3$, 7E20 atoms/cm$^3$, 5E20 atoms/cm$^3$, 3E20 atoms/cm$^3$ and 1E20 atoms/cm$^3$, respectively. When the three-layered polysilicon stack is increased to five, concentration gradient between neighboring polysilicon layer can be reduced by about 2E20 atoms/cm$^3$ per layer. A smaller concentration gradient reduces dopant diffusion and the homogenization of the dopants during annealing. Obviously, the larger the number of doped polysilicon layers, the better the reduction in concentration gradient between neighboring layers is.

In summary, characteristics of the invention includes:

1. Several doped polysilicon layers are formed in sequence over the substrate and the contact opening such that the layer nearest the bottom of the opening has the higher dopant concentration. The particularly high dopant concentration near the contact interface is able to reduce contact resistance. In addition, the formation of a stack of doped polysilicon layer is able to reduce concentration gradient of dopants between neighboring polysilicon layers. Consequently, junction leakage is minimized.

2. All the necessary operations for forming the contact plug including the N+/N− implantation and annealing can be carried out in the same place without the need to transfer to another station.

3. The boat-in temperature and the deposition temperature can be the same. Therefore, productivity can be increased and particle pollution can be reduced.

4. The manufacturing process is simple to implement and suitable for mass production.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a contact plug, comprising the steps of:

providing a silicon substrate having a dielectric layer thereon, wherein the dielectric layer has an opening that exposes a portion of the silicon substrate, and the silicon substrate exposed by the opening has a thin native oxide layer thereon;

depositing polysilicon to form a first conformal doped polysilicon layer and a second conformal doped polysilicon layer over the dielectric layer and an interior surface of the opening, wherein a dopant concentration of the first doped polysilicon layer is higher than that of the second doped polysilicon layer;

depositing polysilicon to form a third doped polysilicon layer over the second doped polysilicon layer, wherein the third doped polysilicon layer fills a remaining opening and has a dopant concentration smaller than those of both the first and the second doped polysilicon layer; and annealing the first, the second and the third doped polysilicon layer.

2. The method of claim 1, wherein the first doped polysilicon layer has a dopant concentration greater than about 6.0E20 atoms/cm$^3$ while the second doped polysilicon layer has a dopant concentration of about 4.0E atoms/cm$^3$.

3. The method of claim 1, wherein the third doped polysilicon layer has a dopant concentration of about 5E19 to 2.0E20 atoms/cm$^3$.

4. The method of claim 2, wherein the first doped polysilicon layer has a dopant concentration of up to about 9E20 atoms/cm$^3$.

5. The method of claim 1, wherein dopants for doping the first, the second and the third doped polysilicon layer include phosphorus.

6. A method for forming a polysilicon plug, comprising the steps of:

providing a dielectric layer, wherein the dielectric layer has an opening that exposes a thin native oxide layer;

forming a stack of conformal doped polysilicon layers over an interior surface of the opening, wherein each polysilicon layer has a slightly different dopant concentration such that dopant concentration increases towards a bottom of the opening;

forming a top doped polysilicon layer over the polysilicon stack so that the opening is filled, wherein dopant concentration of the top doped polysilicon layer is smaller than that of any one of the polysilicon layer in the polysilicon stack; and annealing the polysilicon stack and the top doped polysilicon layer.

7. The method of claim 6, wherein the stack of doped polysilicon layers includes a first doped polysilicon layer having a dopant concentration greater than about 6.0E20 atoms/cm$^3$ and a second doped polysilicon layer having a dopant concentration of about 4.0E20 atoms/cm$^3$ such that the first doped polysilicon layer is closer to a bottom of the opening.

8. The method of claim 6, wherein the top doped polysilicon layer has a dopant concentration of about 5E19 to 2.0E20 atoms/cm$^3$.

9. The method of claim 7, wherein the first doped polysilicon has a dopant concentration of up to about 9E20 atoms/cm$^3$.

10. The method of claim 6, wherein dopants for doping the first, the second and the top doped polysilicon layer include phosphorus.

11. A method for forming a contact plug, comprising the steps of:

providing a dielectric layer, wherein the dielectric layer has an opening that exposes a thin native oxide layer;

performing a cleaning operation to remove a portion of the thin native oxide layer;

placing the dielectric layer inside the chamber of an ultra-high vacuum system;

performing an annealing operation inside an ultra-high vacuum so that a portion of the native oxide is transformed into gaseous silicon oxide and removed;

treating a remaining native oxide with phosphine (PH$_3$);

forming a first conformal doped polysilicon layer and a second conformal doped polysilicon layer over an interior surface of the opening, wherein the first doped polysilicon layer has a dopant concentration higher than that of the second doped polysilicon layer;

forming a third doped polysilicon layer over the second doped polysilicon layer, wherein the third doped polysilicon layer fills the opening and has a dopant concentration smaller than that of the second doped polysilicon layer; and performing an annealing operation so that dopants in neighboring polysilicon layers are able to diffuse according to a concentration gradient so that dopant distribution inside the polysilicon layers is homogenized.

* * * * *